(12) United States Patent
Dent

(10) Patent No.: US 10,148,093 B2
(45) Date of Patent: Dec. 4, 2018

(54) INTER COUPLING OF MICROINVERTERS

(71) Applicant: Koolbridge Solar, Inc., Wrightsville Beach, NC (US)

(72) Inventor: Paul Wilkinson Dent, Pittsboro, NC (US)

(73) Assignee: KOOLBRIDGE SOLAR, INC., Wrightsville Beach, NC (US)

( * ) Notice: Subject to any disclaimer, the term of this patent is extended or adjusted under 35 U.S.C. 154(b) by 507 days.

(21) Appl. No.: 14/740,972

(22) Filed: Jun. 16, 2015

(65) Prior Publication Data

US 2016/0372927 A1    Dec. 22, 2016

(51) Int. Cl.
| | |
|---|---|
| *H02M 7/49* | (2007.01) |
| *H02J 3/38* | (2006.01) |
| *H02M 1/12* | (2006.01) |
| *H02S 40/32* | (2014.01) |
| *H01L 31/05* | (2014.01) |
| *H02S 40/34* | (2014.01) |
| *H02M 7/537* | (2006.01) |
| *H02M 1/00* | (2006.01) |

(52) U.S. Cl.
CPC .......... *H02J 3/383* (2013.01); *H01L 31/0504* (2013.01); *H02M 1/126* (2013.01); *H02M 7/49* (2013.01); *H02M 7/537* (2013.01); *H02S 40/32* (2014.12); *H02S 40/34* (2014.12); *H02M 2001/0077* (2013.01); *H02M 2001/123* (2013.01); *Y02E 10/56* (2013.01)

(58) Field of Classification Search
CPC .......... H02J 3/383; H02S 40/32; Y02E 10/56; Y02E 10/563; H02M 1/126; H02M 7/49; H02M 2001/0077; H02M 2001/123; H01L 31/0504
See application file for complete search history.

(56) References Cited

U.S. PATENT DOCUMENTS

| | | | |
|---|---|---|---|
| 3,340,457 | A | 9/1967 | Schmitz |
| 3,805,141 | A | 4/1974 | Pompa, Jr. et al. |
| 3,958,174 | A | 5/1976 | Studtmann et al. |
| 4,084,220 | A | 4/1978 | Akamatsu |
| 4,180,853 | A | 12/1979 | Scorso, Jr. et al. |

(Continued)

FOREIGN PATENT DOCUMENTS

| | | |
|---|---|---|
| CN | 101350569 A | 1/2009 |
| CN | 202444440 U | 9/2012 |

(Continued)

OTHER PUBLICATIONS

Intersil, George E. Danz, HIP4080, 80V High Frequency H-Bridge Driver, Application Note. AN9324.4, Mar. 2003.

(Continued)

*Primary Examiner* — Ryan Johnson
(74) *Attorney, Agent, or Firm* — Coats & Bennett, PLLC

(57) ABSTRACT

A number of DC-AC microinverters driven by separate photovoltaic sub-arrays are physically combined to use common components such as a common, common-mode choke. Each microinverter is controlled by a common switching controller to produce a portion of the desired output such that ripple on the combined output is minimized, and each microinverter produces a common mode signal on its associated sub-array equal in frequency to the desired AC output frequency.

29 Claims, 14 Drawing Sheets

(56) References Cited

U.S. PATENT DOCUMENTS

| | | | |
|---|---|---|---|
| 4,204,268 A | 5/1980 | Vivirito | |
| 4,320,449 A | 3/1982 | Carroll | |
| 4,803,611 A | 2/1989 | Sashida et al. | |
| 4,882,120 A | 11/1989 | Roe et al. | |
| 5,226,077 A | 7/1993 | Lynn et al. | |
| 5,270,636 A | 12/1993 | Lafferty | |
| 5,373,433 A | 12/1994 | Thomas | |
| 5,424,894 A | 6/1995 | Briscall et al. | |
| 5,479,086 A | 12/1995 | Konstanzer | |
| 5,625,276 A | 4/1997 | Scott et al. | |
| 5,714,869 A | 2/1998 | Tamechika et al. | |
| 5,726,505 A | 3/1998 | Yamada et al. | |
| 5,930,128 A | 7/1999 | Dent | |
| 5,991,645 A | 11/1999 | Yuen et al. | |
| 6,051,954 A | 4/2000 | Nagao et al. | |
| 6,154,379 A | 11/2000 | Okita | |
| 7,057,485 B2 | 6/2006 | Preusse et al. | |
| 7,082,040 B2 | 7/2006 | Raddi et al. | |
| 7,138,730 B2 | 11/2006 | Lai | |
| 7,474,016 B2 | 1/2009 | Wang et al. | |
| 8,891,211 B2 | 11/2014 | Dent | |
| 8,937,822 B2 | 1/2015 | Dent | |
| 9,455,645 B1 * | 9/2016 | Zhou | H02M 7/49 |
| 2002/0047455 A1 | 4/2002 | Dhyanchand et al. | |
| 2003/0094929 A1 | 5/2003 | Pendell | |
| 2003/0094931 A1 | 5/2003 | Renyolds | |
| 2003/0179063 A1 | 9/2003 | Preusse et al. | |
| 2004/0100149 A1 | 5/2004 | Lai | |
| 2005/0001598 A1 | 1/2005 | Belokon et al. | |
| 2005/0056021 A1 | 3/2005 | Belokon et al. | |
| 2005/0073292 A1 | 4/2005 | Hastings et al. | |
| 2005/0180083 A1 | 8/2005 | Takahara et al. | |
| 2006/0158037 A1 | 7/2006 | Danley et al. | |
| 2007/0095062 A1 | 5/2007 | Chertok | |
| 2007/0292724 A1 | 12/2007 | Gilchrist | |
| 2009/0161392 A1 | 6/2009 | Zhang et al. | |
| 2009/0184706 A1 | 7/2009 | Duric et al. | |
| 2009/0206666 A1 | 8/2009 | Seller et al. | |
| 2010/0064424 A1 | 3/2010 | Hsu et al. | |
| 2011/0037600 A1 | 2/2011 | Takehara et al. | |
| 2011/0043160 A1 | 2/2011 | Serban | |
| 2011/0090607 A1 | 4/2011 | Luebke et al. | |
| 2011/0140520 A1 | 6/2011 | Lee | |
| 2011/0285354 A1 | 11/2011 | Iwasa | |
| 2011/0301772 A1 | 12/2011 | Zuercher et al. | |
| 2012/0007459 A1 | 1/2012 | Mondal et al. | |
| 2012/0048325 A1 | 3/2012 | Matsuo et al. | |
| 2012/0049637 A1 | 3/2012 | Teichmann et al. | |
| 2012/0112557 A1 | 5/2012 | Sager | |
| 2012/0242145 A1 | 9/2012 | Espeut, Jr. | |
| 2012/0281444 A1 | 11/2012 | Dent | |
| 2013/0057997 A1 | 3/2013 | Dent | |
| 2013/0058144 A1 | 3/2013 | Hiramatsu et al. | |
| 2013/0070494 A1 | 3/2013 | Rotzoll | |
| 2013/0181655 A1 | 7/2013 | Yokoyama et al. | |
| 2013/0181703 A1 | 7/2013 | Ausserlechner | |
| 2013/0245614 A1 | 9/2013 | Seebruch | |
| 2013/0320929 A1 | 12/2013 | Walker et al. | |
| 2014/0062206 A1 | 3/2014 | Bryson | |
| 2014/0084687 A1 | 3/2014 | Dent | |
| 2014/0153303 A1 * | 6/2014 | Potharaju | H02M 7/06 363/126 |
| 2014/0266289 A1 * | 9/2014 | Della Sera | H02S 50/00 324/761.01 |
| 2015/0008748 A1 * | 1/2015 | Deboy | H02J 3/383 307/77 |
| 2015/0043110 A1 | 2/2015 | Dent | |
| 2015/0217656 A1 | 8/2015 | Loftus et al. | |
| 2015/0229131 A1 | 8/2015 | Gerhardinger | |
| 2015/0288225 A1 | 10/2015 | Dent | |
| 2015/0295413 A1 | 10/2015 | Dent | |
| 2015/0318796 A1 | 11/2015 | Dent | |
| 2015/0349708 A1 | 12/2015 | Moslehi | |
| 2016/0036235 A1 | 2/2016 | Getsla | |
| 2016/0065090 A1 | 3/2016 | Dent | |
| 2016/0224083 A1 | 8/2016 | Dent et al. | |
| 2016/0226560 A1 | 8/2016 | Dent | |
| 2016/0261226 A1 | 9/2016 | Hamilton et al. | |
| 2016/0276837 A1 * | 9/2016 | Manjrekar | H02J 3/383 |
| 2017/0346413 A1 | 11/2017 | Dent | |
| 2018/0006601 A1 | 1/2018 | Dent | |
| 2018/0026550 A1 | 1/2018 | Dent | |

FOREIGN PATENT DOCUMENTS

| | | |
|---|---|---|
| EP | 2544354 A2 | 1/2013 |
| EP | 2698894 A2 | 2/2014 |
| GB | 1433402 A | 4/1976 |
| WO | 2012140495 A2 | 10/2012 |
| WO | 2016033394 A1 | 3/2016 |

OTHER PUBLICATIONS

Kwasinski, Alexis, University of Texas at Austin, Syllabus at http://users.ece.utexas.edu/~kwasinski/EE462LS14.html; Slides at http://users.ece.utexas.edu/~kwasinski/10_EE462L_H_Bridge_Inverter_Basics.ppt; Both last accessed Apr. 8, 2018.

* cited by examiner

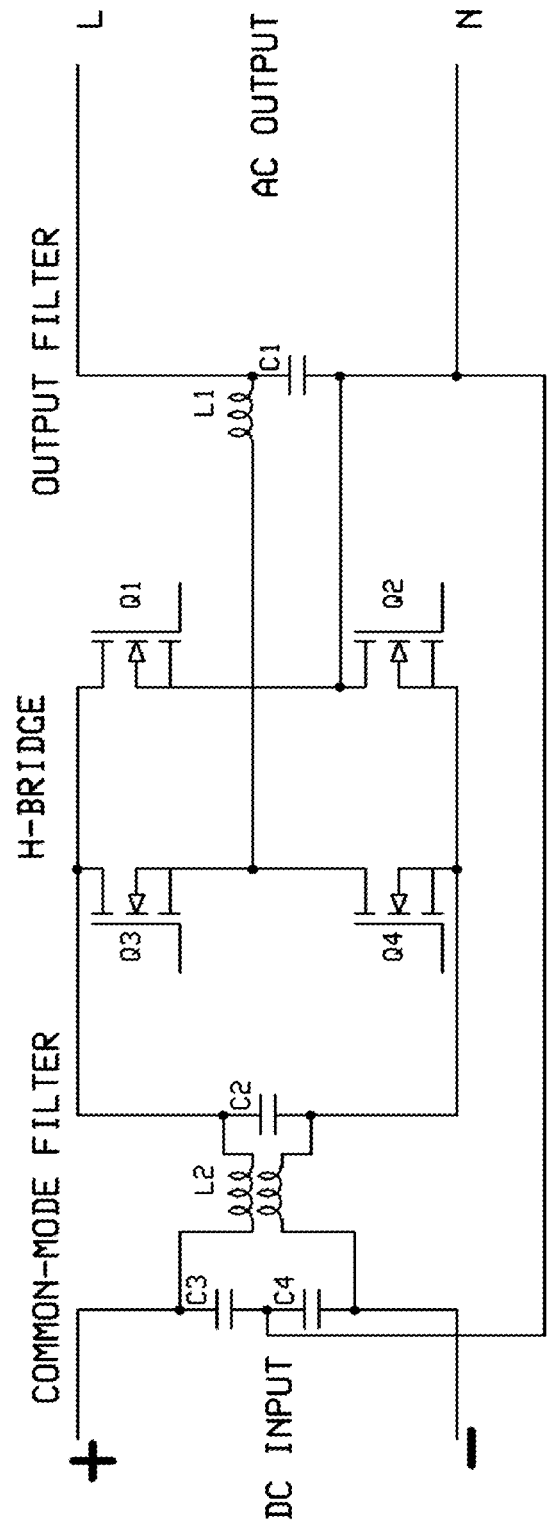

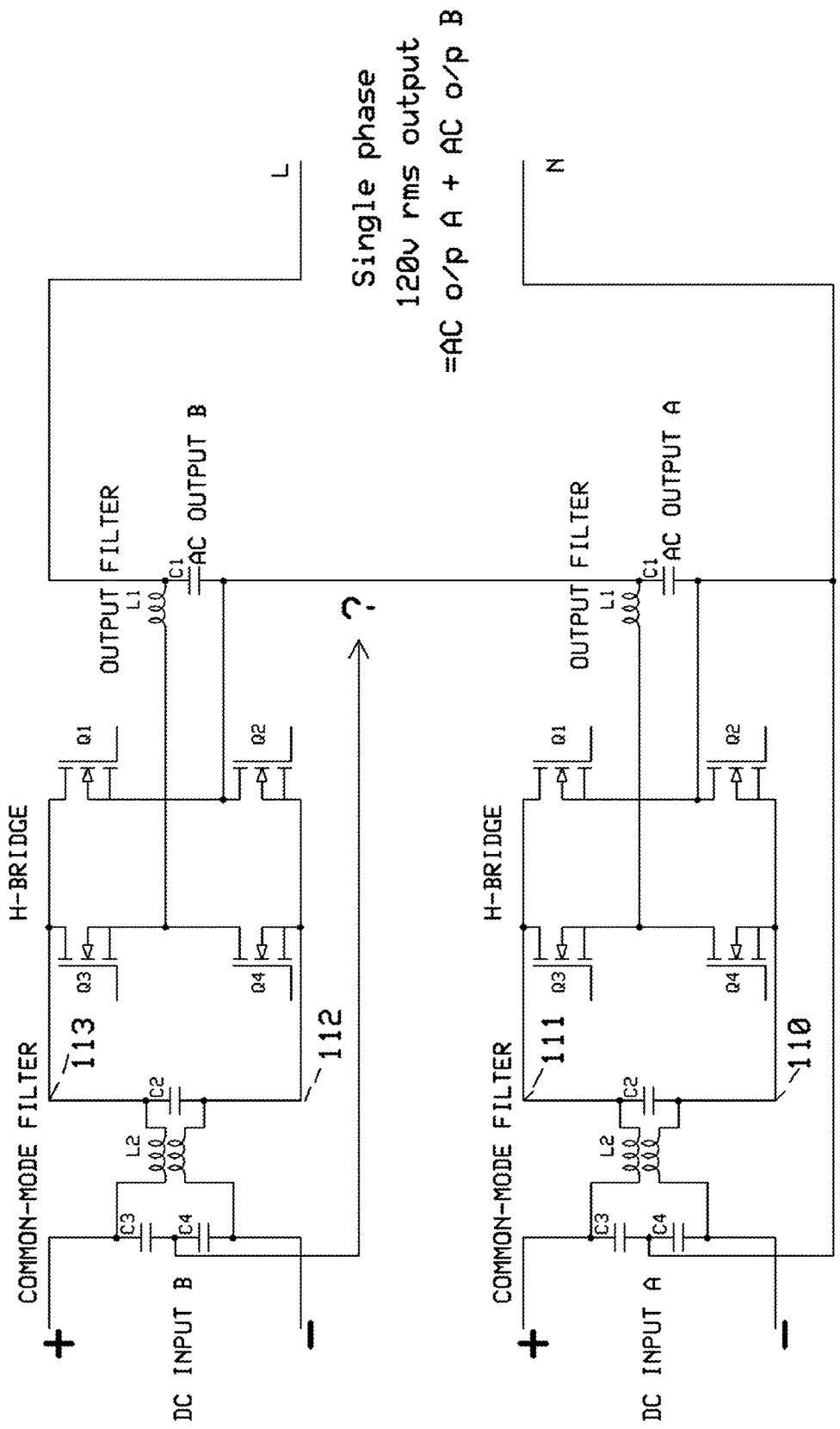
Figure 2: Two microinverters connected to a single-phase grid

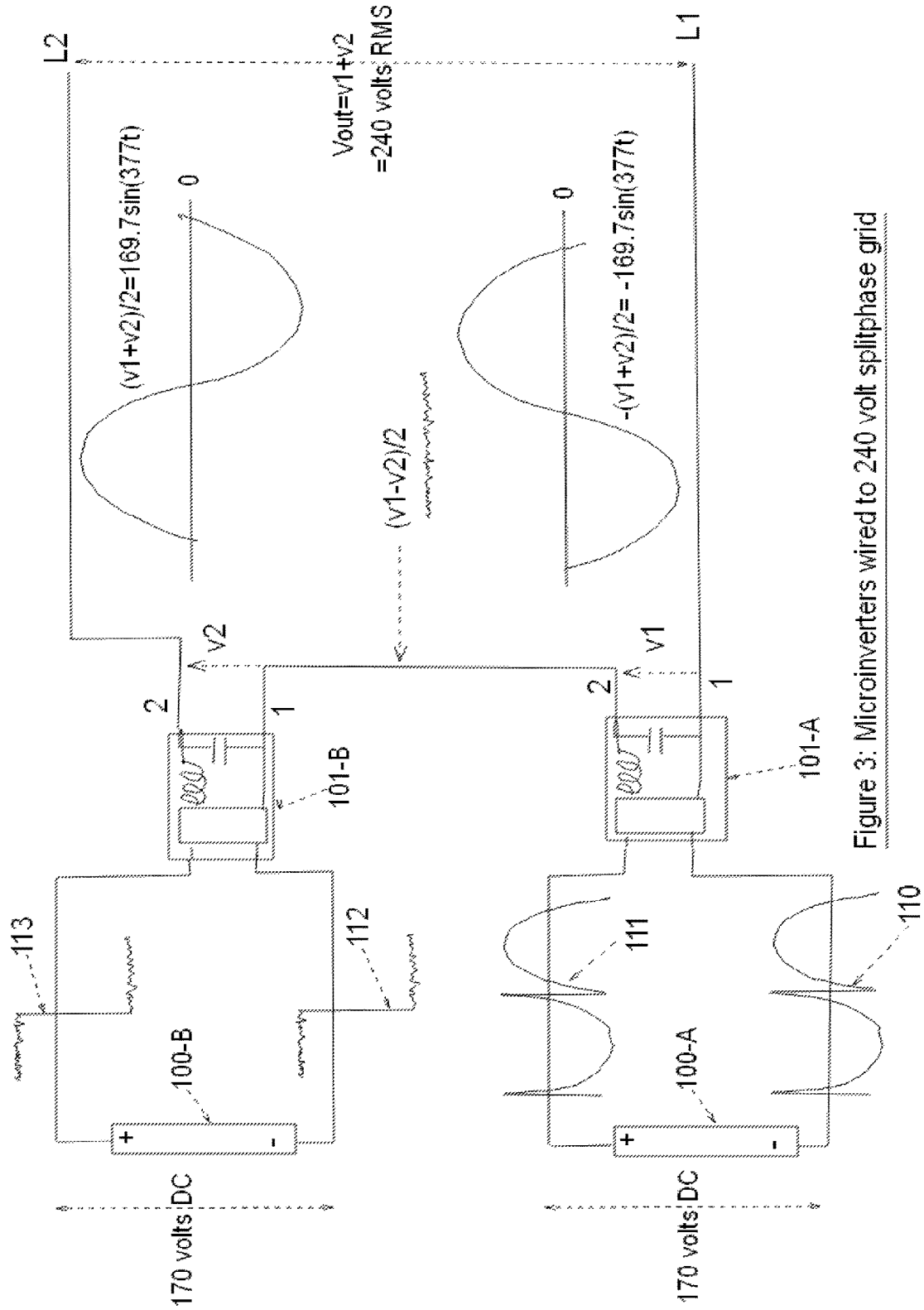

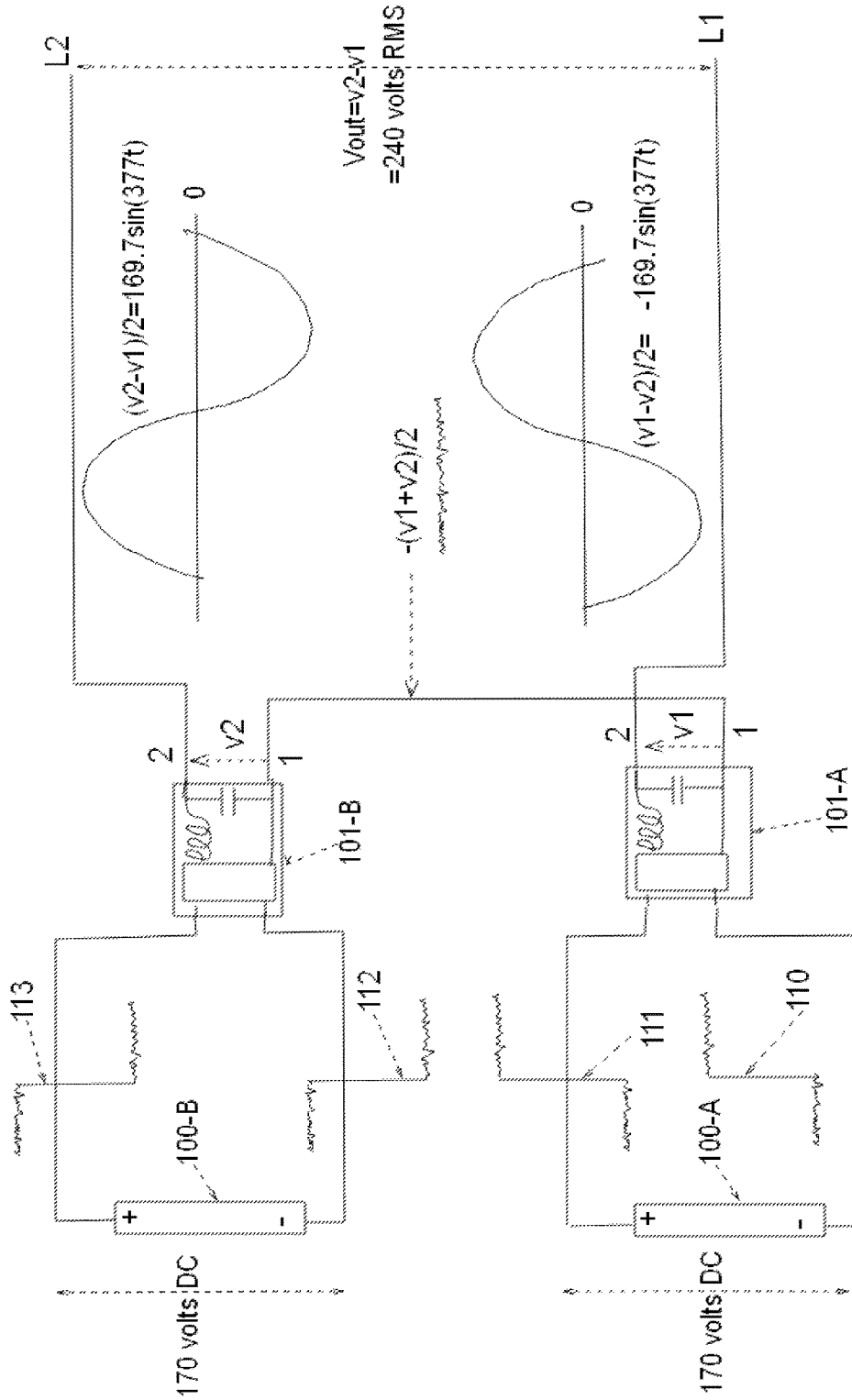
Figure 4: Microinverters wired in antiphase to 240 volt splitphase grid

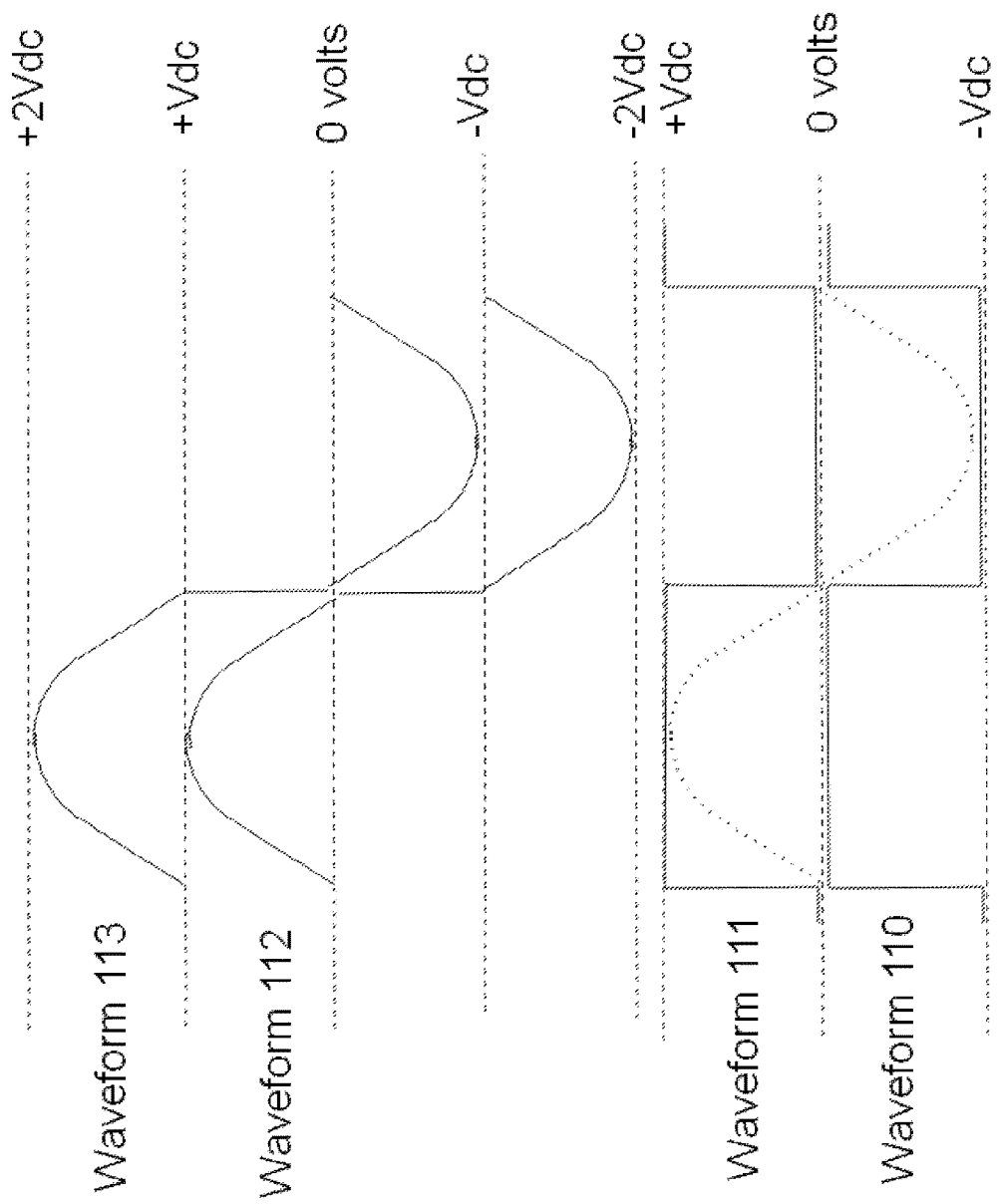
Figure 5: Common Mode Waveforms of figure 2

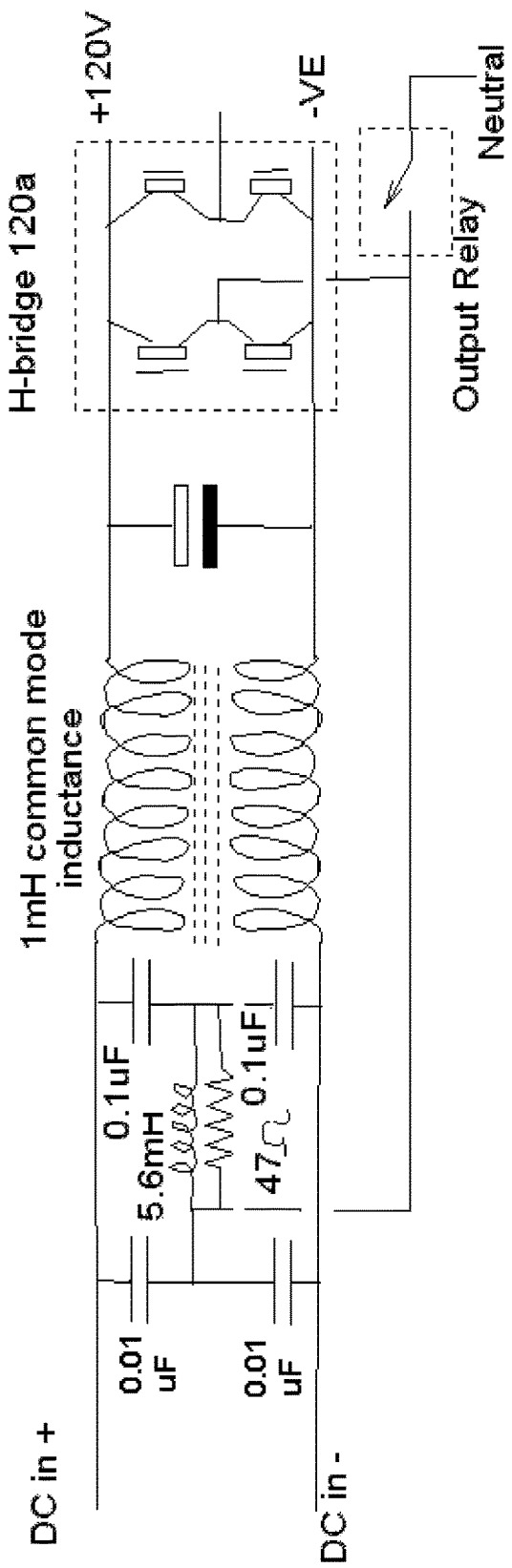
FIGURE 6: COMMON MODE INPUT HASH FILTER

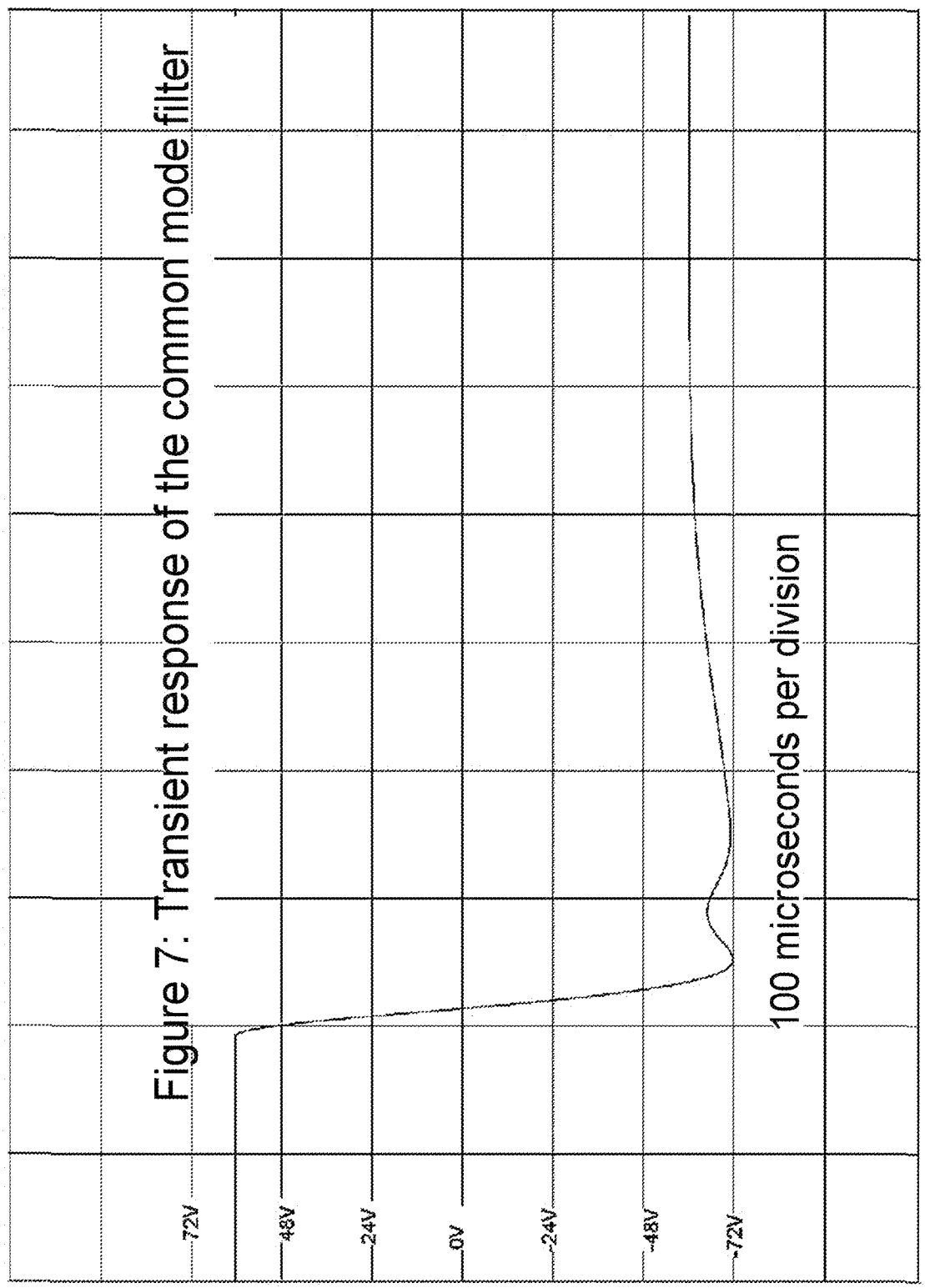

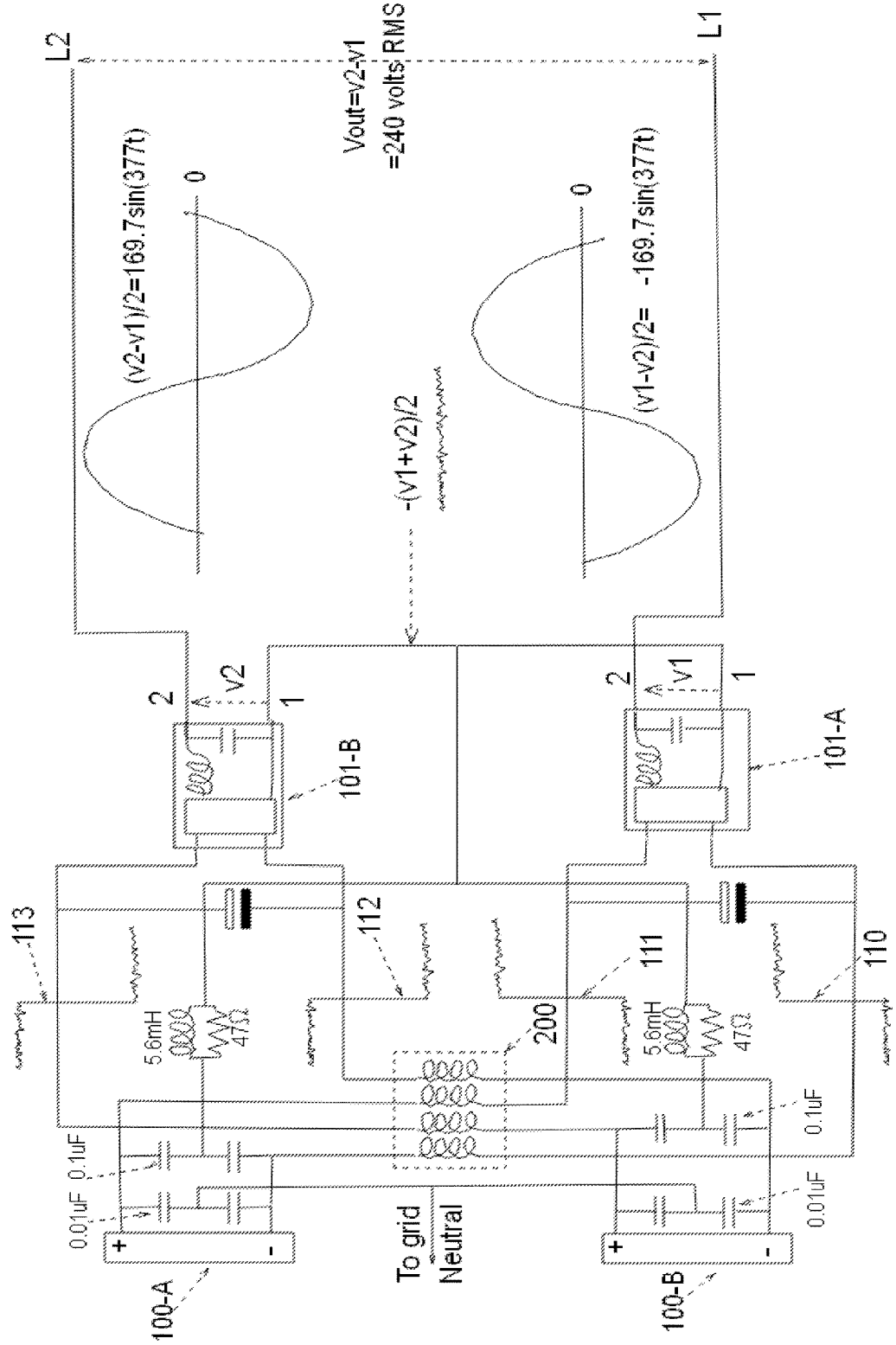

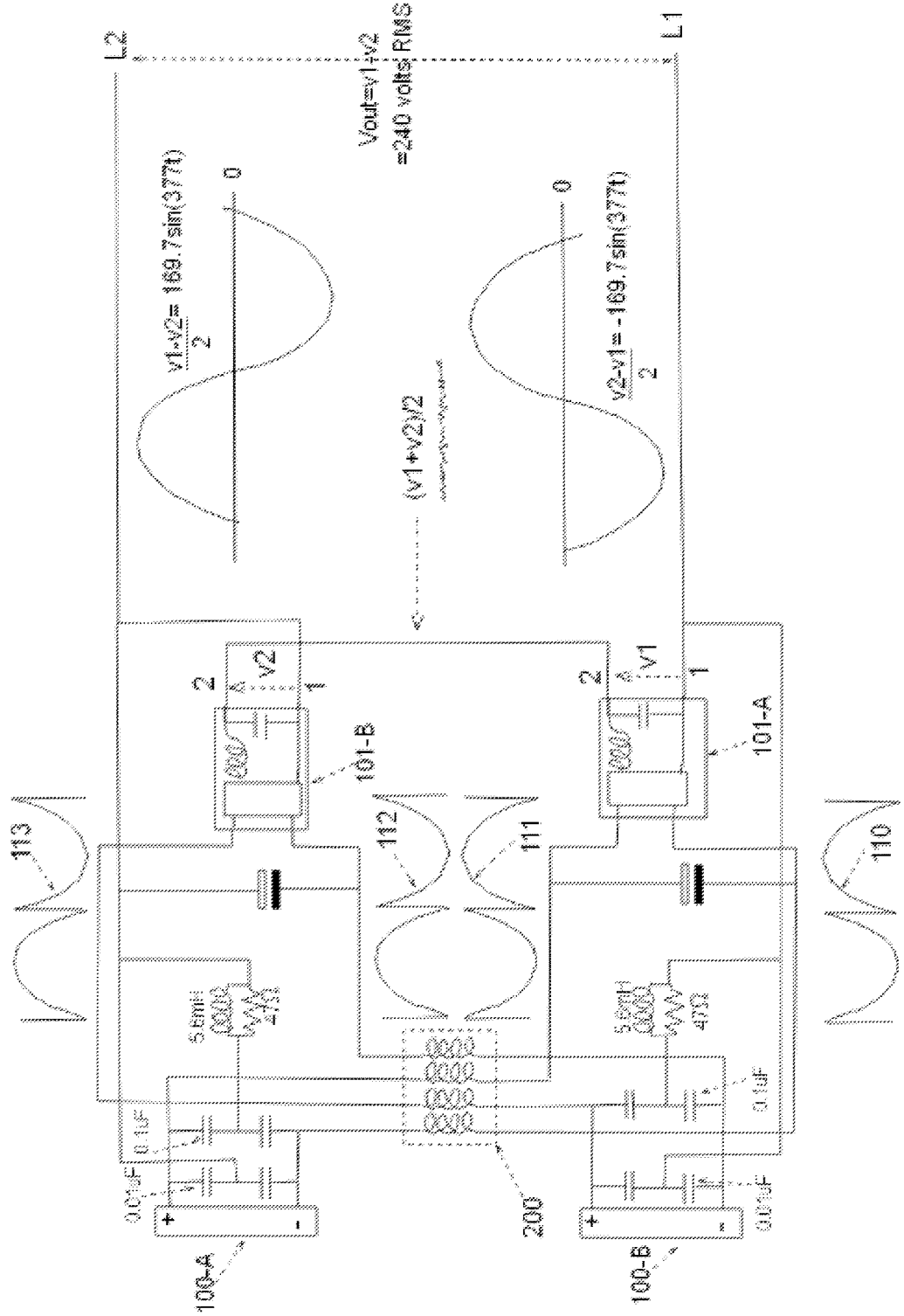
Figure 9: Another arrangement of antiphase Microinverters sharing a common-mode choke

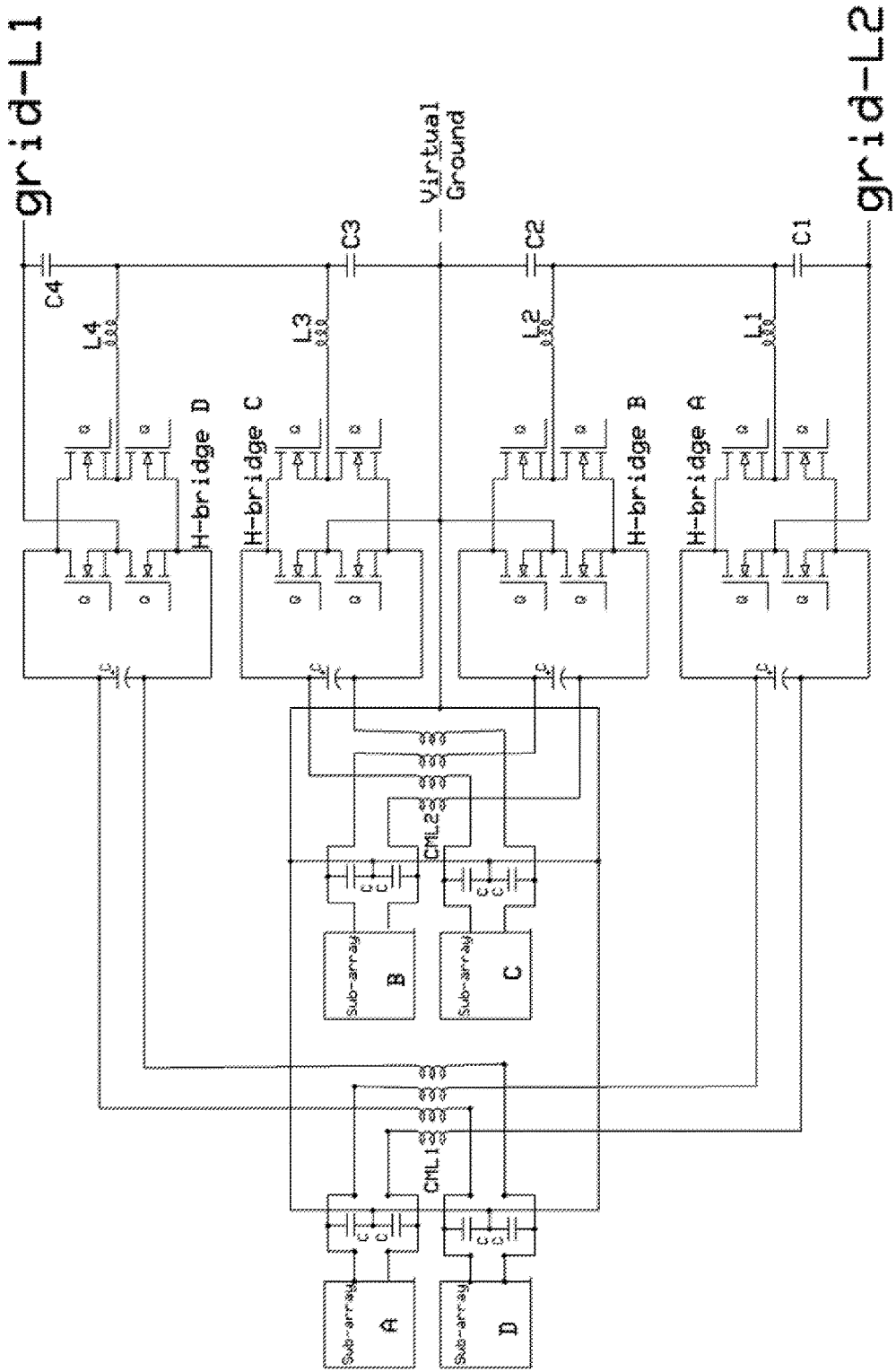
Figure 10: Series connection of 4 microinverters

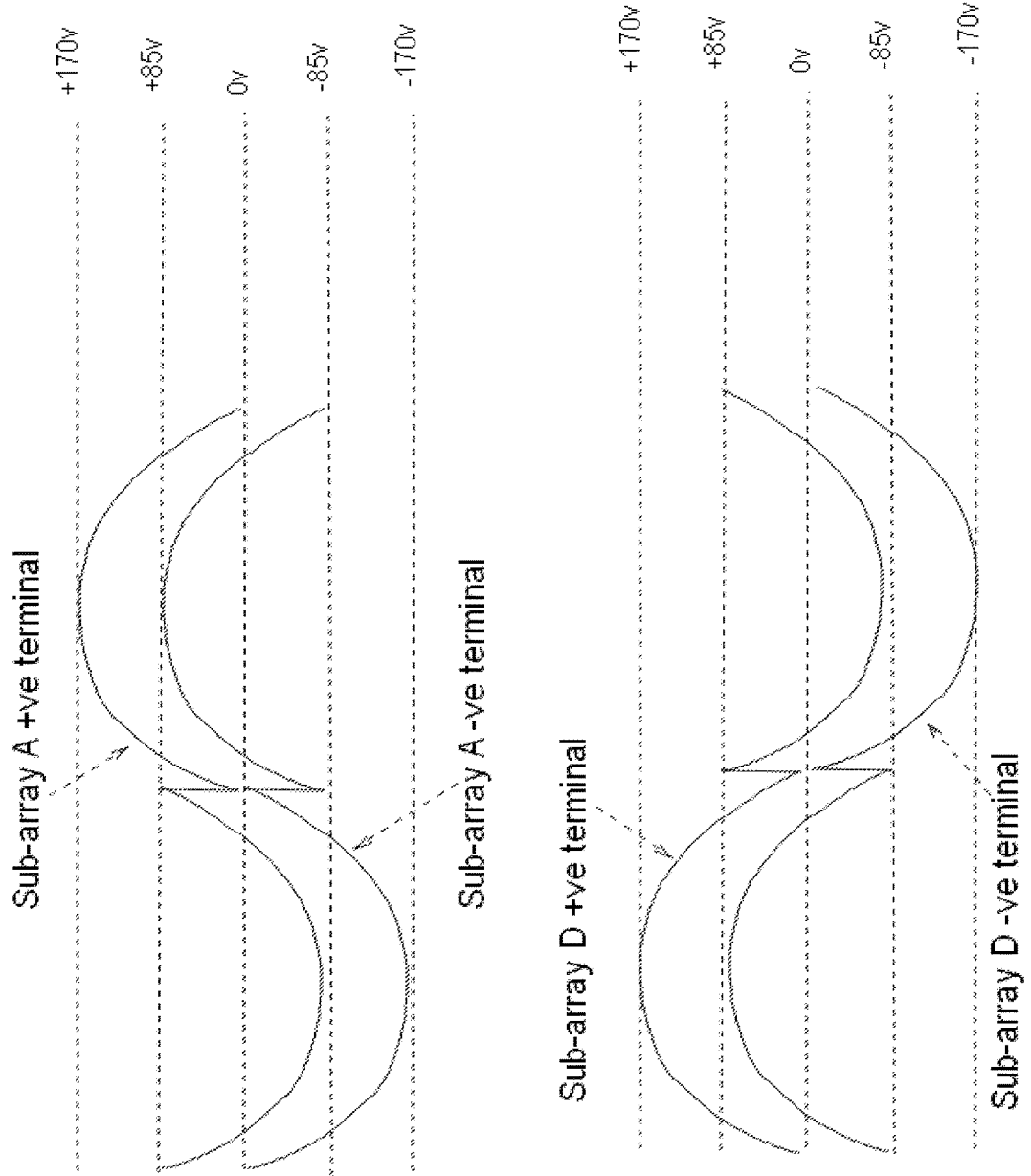
Figure 11: Common mode waveforms for figure 10

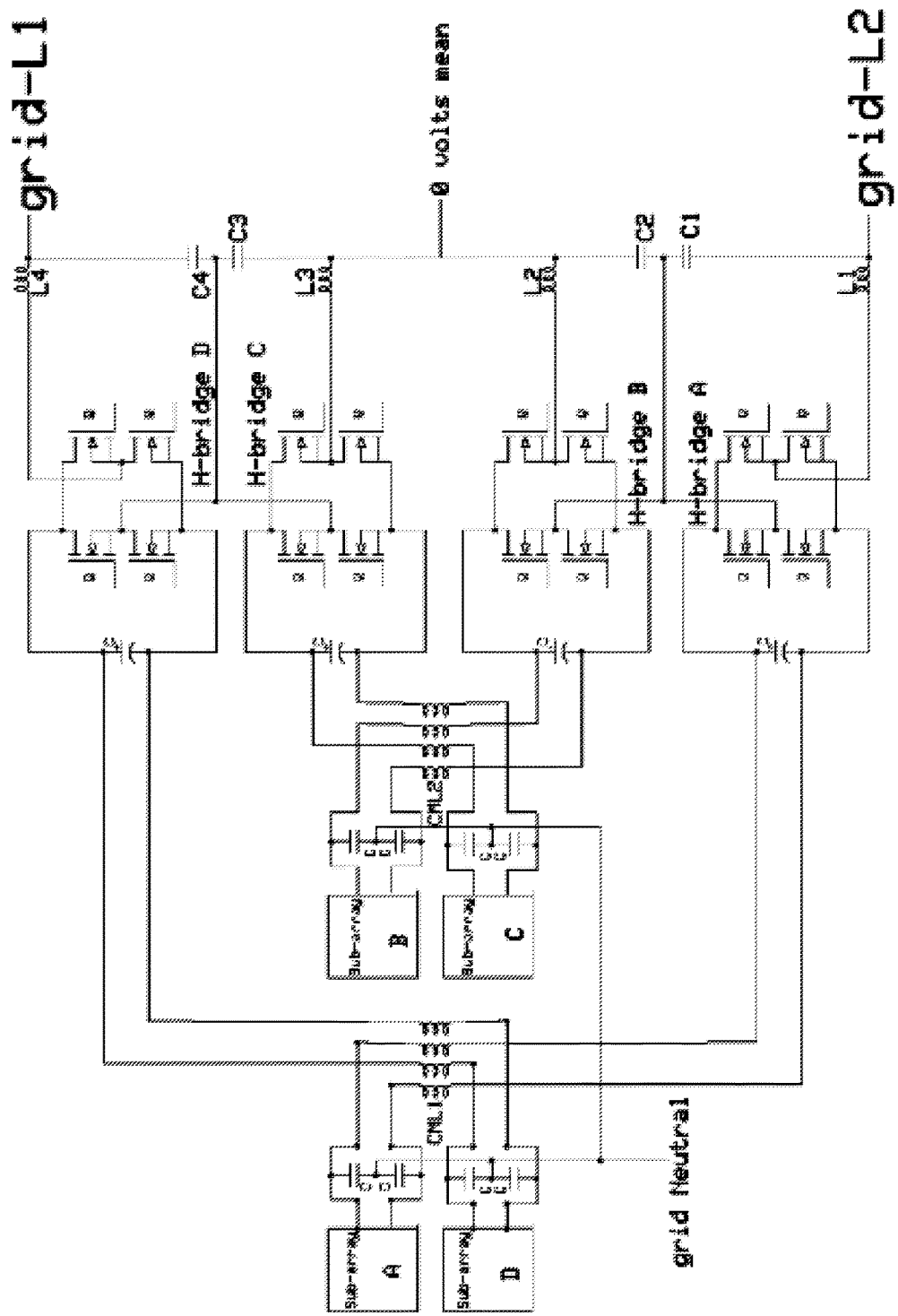
Figure 12: Another series connection of 4 microinverters

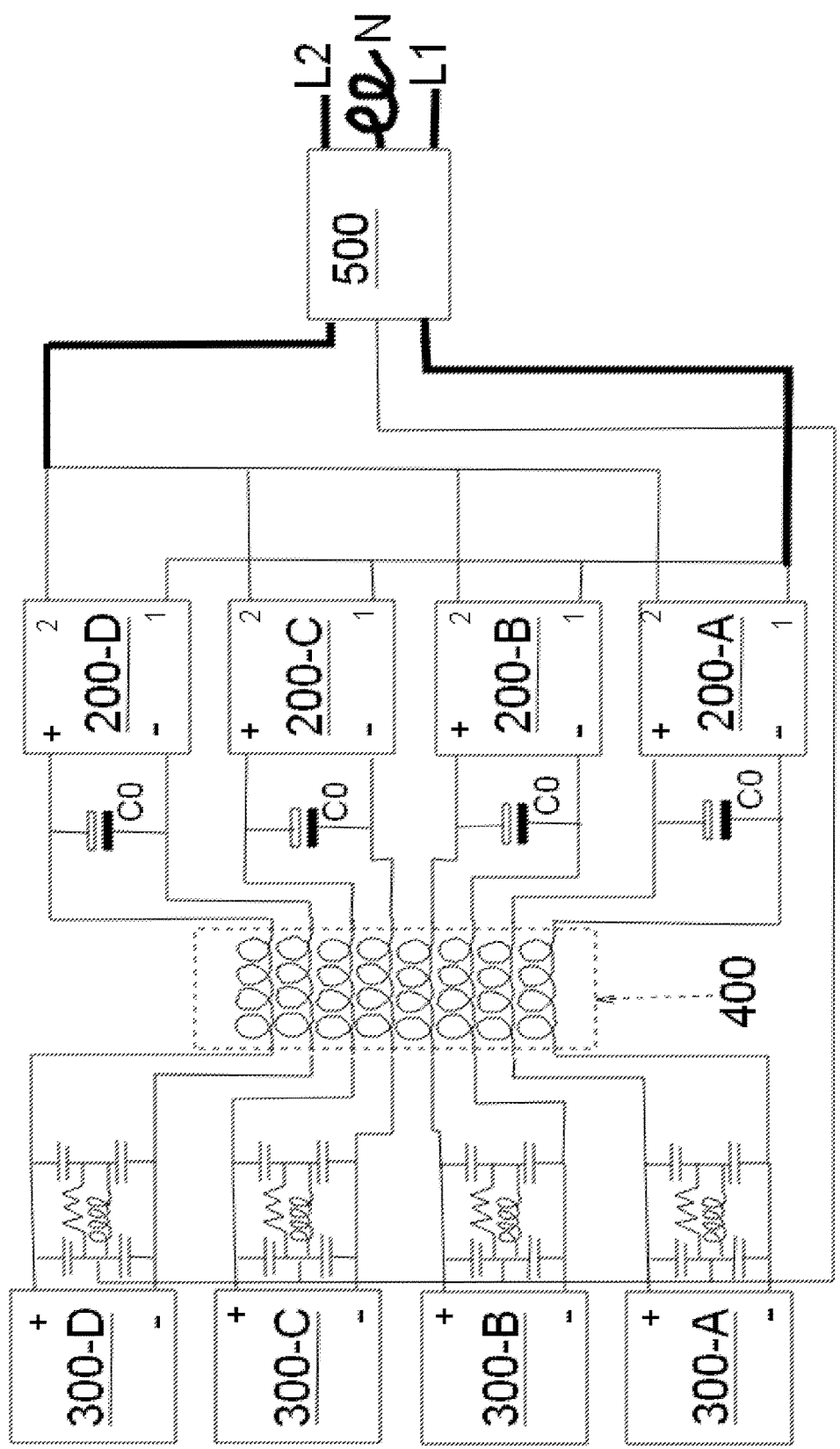
Figure 13: Parallel connection of microinverters

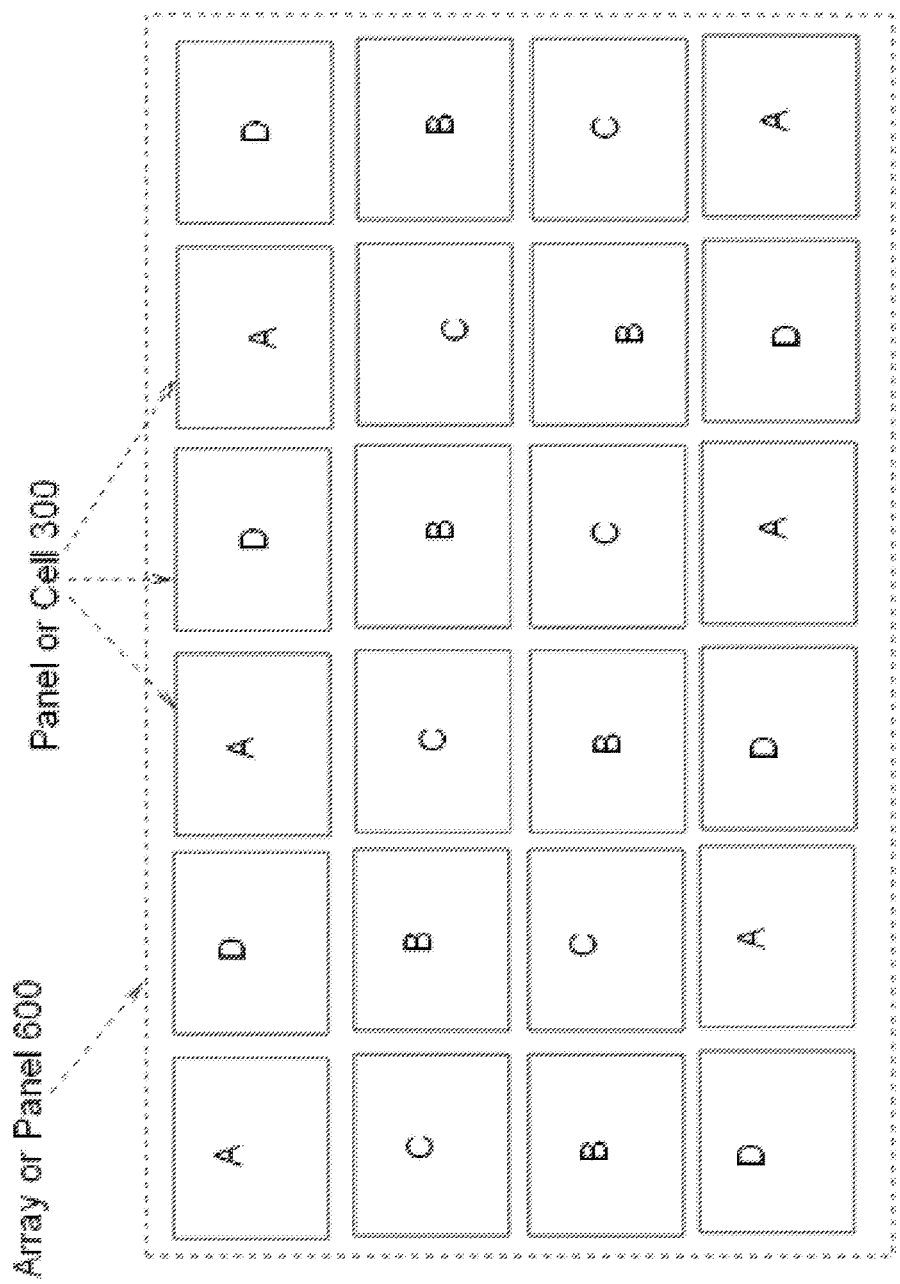

INTER COUPLING OF MICROINVERTERS

BACKGROUND

The present invention relates to DC-to-AC convertors for electric power systems. Lower cost, high-power, efficient, DC-to-AC convertors are of interest for solar energy economics. In the prior art, DC-AC inverters are the second highest cost item next to the photovoltaic panels. For high efficiency and low heat dissipation, commutation of DC to produce AC preferably uses solid state switches that are either fully on or fully off, and do not dwell more than a microsecond or so in an intermediate state. Therefore it is more complicated to produce a sine wave that takes on all values between the negative peak and the positive peak. On the other hand, producing a square wave which switches between the positive peak and the negative peak produces a form of AC that is not suitable for all loads.

Various manufacturers provide prior art DC-AC convertors that fall into one of a few broad classes and operating modes. The class of "modified sine wave" converters maintains both the same rms and the same peak voltage as a sine wave, while still employing only on-off commutation. This is done by switching the voltage between the desired positive peak, zero and the negative peak, spending 50% of the repetition period at zero, therefore achieving both the same peak and the same rms values as a true sine wave, and being compatible with a greater variety of loads.

Still, there are loads that do not tolerate the modified sine wave; for example appliances that present inductive loads, such as induction motors, some cellphone and laptop battery chargers, fluorescent lamps and tumble dryers, and any device with an internal power supply that uses capacitive reactance as a lossless voltage-dropping means, can malfunction on modified sine waveforms. Moreover, there is a potential problem with radio and TV interference due to the high level of harmonics of the modified square wave converter. Such a waveform is therefore not a candidate for coupling solar-generated power into the utility network or into house wiring.

"True sine wave" is another class of prior art DC-AC converter, and is required for coupling power into the grid or into premises wiring.

Another categorization of convertor relates to whether they are designed to power loads directly, or whether they are designed to feed and sell power back into the electricity grid. A load inverter that can power loads directly is said to operate in standalone mode, and is also called a "standalone inverter", while a grid-tie inverter is said to operate in grid-interactive mode and is also called a "grid-interactive inverter".

For safety and other reasons, the latter have to meet different specifications than the former, especially under fault conditions. In particular, a load inverter should be a constant voltage source, while a grid-tie inverter does not have a constant voltage output but must adapt to the voltage of the grid, and is rather a controlled current source. Moreover, a load inverter is always used with energy storage such as a rechargeable battery, and should maintain efficiency at both light and heavy loads and have low, no-load power consumption, so that the battery is not discharged while the inverter is idling at night. Grid-tie inverters however do not have the same a requirement for no-load power consumption, as they do not operate at night.

Many prior art inverters used low-frequency transformers in the synthesis of sine waveforms, but the large amount of copper and iron required for low-frequency transformers adds significant cost and weight.

Transformerless inverters are known in the prior art, particularly for utility-interactive inverters, which use high-frequency switching or pulse width modulation to approximate a sine wave. However, a disadvantage that arises in certain of these these converter concepts is the imposition of the high-frequency switching waveform on the solar array, which can capacitively couple through the glass cover upon touching it, potentially causing RF burn to personnel or damage to the solar panel, as well as causing the solar array to radiate substantial radio interference. Thus a design is required that can create a more benign common-mode voltage fluctuation on the solar array DC conductors.

One known method of making grid-tie inverters to convert DC power from a solar array to AC power than can be back fed into the grid is to employ multiple microinverters connected to the grid in parallel. This arrangement has been pioneered by, for example Enphase Inc.

When microinverters are attached to each solar panel, the advantage is the elimination of DC wiring, for which the National Electrical Code has specified new, unusual and onerous regulations.

However, multiple microinverters are more costly than a single large inverter. There is therefore the desire to reduce the cost of multiple microinverters to equal or better the cost of a single large inverter while retaining the benefit of eliminating DC wiring inside the premises.

SUMMARY

Microinverter apparatus and arrangements for combining multiple microinverters are described that allow the use of some common components among the multiple microinverters for reduced cost, as well as achieving a benign common-mode voltage fluctuation at solar array terminals.

Each microinverter apparatus comprises input terminals for a floating DC input from one or more strings of photovoltaic cells, a pair of AC output terminals, a low pass LC filter with its output connected to a first of the AC output terminals and an H-bridge of switching transistors for selecting either the positive or the negative polarity of the DC source to be connected to either the low pass filter's input or to a second of the AC output terminals, and a controller for controlling the switching of multiple microinverters using any switching approximation using two or more signal levels such as delta or delta sigma modulation or pulse width modulation to provide an approximation to a desired waveform. The H-bridge alternates between connecting the positive and the negative of the associated solar array to the second of the AC output terminals only at the low, sign-changing rate of the desired AC output, thus avoiding imposing a high common-mode frequency on the array.

The microinverter outputs may be combined in series to increase the total output voltage or in parallel to increase the total output current, or in a combination of parallel and series connections. In all cases, the controller may optimize the switching of each microinverter so that the combined voltage or current waveform or both approximates a desired sine wave with as little as possible unwanted ripple due to residual unfiltered switching components.

A common mode filter is employed to slow the edges of the low-frequency common-mode switching signal imposed on the array to reduce the export of radio frequency interference. It is disclosed that a common, multifilar common-mode mode choke can be used with inventive methods of combining the microinverter outputs, thus reducing total component count.

BRIEF DESCRIPTION OF THE DRAWINGS

FIG. 1 shows the basic arrangement of a microinverter

FIG. 2 shows two microinverters connected in series to a single phase 120 volt rms grid.

FIG. 3 shows two microinverters connected in series to a split-phase 240 volt rms grid.

FIG. 4 shows antiphase inverters connected in series to a 240 v split-phase grid FIG. 5 shows the common mode waveforms of the arrangement of FIG. 2.

FIG. 6 shows a common mode hash filter

FIG. 7 shows the transient response of a common mode hash filter

FIG. 8 shows two antiphase microinverters sharing a common-mode choke

FIG. 9 shows another arrangement of microinverters sharing a common-mode choke.

FIG. 10 shows a series connection of four microinverters sharing two common-mode chokes FIG. 11 shows the common mode waveforms of FIG. 10

FIG. 12 shows a another series connection of four microinverters

FIG. 13 shows a parallel connection of four microinverters

FIG. 14 shows an interleaving arrangement for panels within a solar array connected to respective microinverters A, B, C and D

DETAILED DESCRIPTION

FIG. 1 shows the basic circuit arrangement of a microinverter. This arrangement of an inverter was disclosed in U.S. Pat. No. 9,735,703 to current Inventor, which is a continuation of U.S. Pat. No. 8,937,822. These patents are hereby incorporated by reference herein in their entirety.

The circuit of FIG. 1 shows a DC input connected through a common mode filter comprised of C2,C3,C4 and L2 to an H-bridge of switching transistors Q1,Q2,Q3,Q4. One of the H-bridge output lines is connected to a first AC output terminal labeled N while the other H-bridge output line is connected through the low-pass filter comprised of L1 and C1 to the second AC output terminal labeled L. If used alone as a grid-tie inverter connected to a single phase of the grid, the AC output terminals L and N would signify the Live and Neutral lines of the single phase grid. In that case, for a 120 volt RMS grid, the DC input voltage would have to be at least $120\sqrt{}=169.7$ volts. When L1 is small, it was discussed in the above-incorporated patent and applications how achieving the desired power flow into the grid requires precise control of the AC output voltage and phase generated by the H-bridge.

Description of the operation of FIG. 1 is summarized below.

When the desired output is a positive-going half cycle of the 120 volt RMS grid, transistor Q2 is turned on to connect the negative polarity of the 170 volt DC supply to terminal N, while transistors Q3 and Q4 connect filter inductor L1 alternately to the +ve and −ve polarity of the supply with a duty factor that, after filtering with L1,C1, provides the correct mean positive voltage corresponding to some point of the positive half cycle of the desired sine waveform. The duty factor variation can be in the form of multiples of a constant time period at + or − according to a delta-sigma bit sequence, or can be in the form of variable time periods according to a pulse width modulation approximation.

On the other hand, when the desired output is the negative-going half cycle of the 120 volt RMS grid, transistor Q1 is turned on to connect the positive polarity of the 170 volt DC supply to terminal N, while transistors Q3 and Q4 connect filter inductor L1 alternately to the −ve and +ve polarity of the supply with a duty factor that provides the correct negative mean voltage point on the negative half cycle after filtering.

Since the +ve and −ve of the supply are thus alternately connected to the neutral terminal N (which is ultimately grounded and thus at zero volts), the common mode signal before common-mode filtering is simply a low-frequency square wave.

An advantage of the arrangement of FIG. 1 is thus that the common mode signal created on the solar array feeding the DC input is relatively benign, consisting of a square wave at the line frequency (e.g. 60 HZ) with the sharp edges removed by the common mode filter.

The simplified common mode filter shown in FIG. 1 incorporates no damping; therefore the response to a common mode square wave would exhibit very large ringing of long duration. To avoid this ringing, a practical common mode filter must incorporate damping as was shown in the above-incorporated references. The design of common mode filter from the references is shown in FIG. 6, and its transient response is shown in FIG. 7.

In FIG. 6, the common mode damping is provided by the 47 ohm resistor connected from the center of tap of the two 0.1 uF capacitors to neutral and ultimately ground. Simulation showed that, while the filtering of the common mode signal results from the 1 mH common mode inductance and the two 0.01 uF capacitors, the damping is only effective if the capacitors coupling to the damping resistor are an order of magnitude greater. This can couple some 60 Hz and harmonic power in the several hundred milliwatt region into the damping resistor as waste energy, which however is reduced to about 183 mW by paralleling the 47 ohm resistor with a 5.6 mH choke, its value being chosen to optimize the transient response as shown in FIG. 7. Thus, filtering the common mode signal inevitably requires a damped filter, and the filter damping can cause energy wastage unless care is taken to minimize it.

The common mode filter design of FIG. 6 is for a particular inverter power level of 60 amps times 120 volts RMS, i.e. 7.2 kilowatts, and values can be impedance-scaled for other voltages and currents. For example, if a microinverter is designed to output 60 volts and 30 amps RMS, the impedance scaling is unity and the same filter can be used.

FIG. 2 shows the connection of two 60 volt RMS inverters in series to produce 120 volts RMS for coupling to a single-phase grid. To produce 60 volts rms out, the DC input to each microinverter must in the 85 volt region at a minimum.

The series coupling of FIG. 2 couples the L terminal of the lower microinverter to the N terminal of the upper microinverter. If the lower inverter produces the voltage output labeled AC OUTPUT A and the upper inverter produces the voltage output labeled AC OUTPUT B, then the total output across the grid L and N lines will be the sum of AC OUTPUT A and AC OUTPUT B voltages. Thus the two 60 volt RMS microinverters in series generate the required 120 volts RMS.

It is of interest to examine the common mode waveforms of the arrangement of FIG. 2. The common mode waveforms before common-mode filtering appear at circuit nodes (110, 111, 112 and 113). FIG. 5 shows these waveforms.

Since the lower inverter has its N output terminal connected to the grid neutral, its common mode waveforms are exactly the same as for FIG. 1, except with half the voltage swing due to the 85 volt supply instead of 170 volts. The negative node (110) alternates between 0 volts (neutral) and −85 volts (when the plus is grounded), while the positive node (111) follows it with a constant offset of 85 volts. The offset is constrained to be constant due to capacitor C2 of FIG. 1, which is large. C2 must be large, as described in the incorporated '822 patent, as the DC current taken by an inverter is a raised cosine waveform of twice the line frequency and having twice the peak AC output current. Since the array can only supply a constant current, C2 must act as a reservoir to smooth out the current demand to the array and is typically a plurality of large aluminum electrolytic capacitors in parallel.

FIG. 5 shows that the common-mode signal on the upper inverter's array terminals (112 and 113) looks completely different. This is because the upper inverter's N terminal is not connected to the grid neutral, but rather to the 60 volt RMS output from the lower inverter's L terminal. Thus the common mode signals at nodes 112 and 113 comprise an 85 volt peak to peak 60 Hz square wave added to a 85 volt peak sine wave, and their fundamental components are in phase, which increases the amplitude to 255 volts peak-to-peak. Now referring to the common mode filter of FIG. 6, if the center tap of the two 0.01 uF capacitors and the 47 ohm damping resistor were taken to ground/neutral, the 60 Hz component being dissipated in the 47 ohm resistor would be substantially higher; on the other hand, if taken to the N terminal of the upper inverter which is connected to the L output terminal of the lower inverter, the common mode signal would contain all residual, unfiltered high frequency switching components of the lower inverter. Thus there is dilemma, indicated by the ? mark in FIG. 2, as to where the common-mode filter return should be connected. It may be that the center tap of the upper common-mode filter's 0.01 uF capacitors should be returned to grid neutral to ensure that the inverter hash from the lower inverter is attenuated, while the damping resistor is returned to the N terminal of the upper inverter to reduce 60 Hz dissipation in the damping resistor; however, the upper and lower microinverters would then be slightly different. This may not be an issue, but some other configurations that preserve symmetry will be examined.

Another configuration is shown in FIG. 3. In this case two microinverters 101-A and 101-B of the FIG. 1 type each generate 120 volts RMS, in phase, and so may be connected in series to generate 240 volts RMS, with the L terminal, now labeled 2, of the lower inverter (101-A) being connected to the N terminal, now labeled 1, of the upper inverter (101-B). Moreover, the 240 volt output is connected to a split-phase grid having an L1 terminal and an L2 terminal, both carrying 120 volts RMS, but in antiphase, so that the difference between them is 240 volts RMS.

The common mode waveforms at nodes 110, 111, 112, and 113 are now indicated in the same FIG. 3. The waveforms can be explained by realizing that they are as per FIG. 5, except that the grid neutral terminal of FIG. 2 has been replaced by a grid L1 terminal carrying an antiphase 60 Hz sine wave of 120 v RMS. The waveform on L1 thus subtracts from the waveforms shown in FIG. 5, removing the sine wave from nodes 112 and 113 of FIG. 5 and leaving only the square wave common mode signal, while the common mode signals on nodes 110 and 111 of FIG. 3 are the sum of a square wave and an antiphase 60 Hz sine wave. The latter is very desirable, as the 60 Hz component has been substantially reduced, actually by the factor $4\pi-1$, or 0.27. This gives lower dissipation in the common-mode filter damping resistor. Likewise, the dissipation in the upper inverter's common mode filter (relative to the total output power to the grid) is reduced as compared to the waveform of FIG. 5.

The difference between the common-mode waveforms of the upper and lower inverters of FIG. 3 arises because the lower inverter (101-A) alternately connects the +ve and −ve of the solar array to a grid line, while the upper inverter (101-B) alternately connects its solar array +ve and −ve to terminal 2 of the lower inverter (which is virtual neutral at a mean of zero volts), and not a grid line. This asymmetry is removed in the arrangement of FIG. 4.

In FIG. 4, two microinverters (101-A and 101-B) are connected in series by connecting their terminals (1) together while connecting their terminals (2) respectively to the L1 and L2 grid lines. Since the combined voltage is now the difference between their respective output voltages V2 and V1, they must be operated in antiphase to obtain constructive voltage addition. It is known to do this in the prior art of inverters such as the Xantrex SW4048, which, however, do not produce common mode signals on the DC input lines as they use isolation transformers to obtain the 60 Hz AC outputs, and are intended to operate from a common DC source.

It may be seen in FIG. 4 that this arrangement cancels the 60 Hz sine wave component from the common-mode of both DC inputs, leaving the familiar square wave common-mode signal, and both microinverters are operating identically. This is because each inverter alternately connects the +ve and −ve polarities of its associated DC source to the same common point of the junction of the inverters' output terminals (1), which should be a virtual neutral/ground and therefore at nominally zero voltage. It's voltage is actually minus half the sum of the inverters' respective output voltages V1 and V2, which, since V1 and V2 are in antiphase, should cancel to zero. It is not exactly zero however, but carries residual unfiltered components of the switching waveforms, abbreviated to "ripple". The ripple thus gets imposed on the terminals of arrays 100A and 100B and may cause radio interference by being radiated from the arrays unless adequately attenuated by filters 101-A and 101-B. On the other hand, the 60 Hz component of the common mode signal is now out of phase on array 100A compared to array 100B. If the arrays are physically close, or even better, if individual panels or even individual solar cells are interleaved, this results in a substantial reduction of any radiated 60 Hz hum component that could couple to inadequately screened audio devices on the premises. For example, FIG. 14 shows one possible interleaving arrangement for panels or sub-arrays A, B, C and D of FIG. 10. The 60 HZ common mode signals on sub-arrays A and D are in antiphase as are the common mode signals of sub-arrays B and C. Therefore the interleaving of sub-arrays A and D horizontally and of B and C horizontally combined with the vertical interleaving of A/D rows with C/B rows has the effect that adjacent sub-arrays have anti-phase 60 Hz common-mode components. Capacitive coupling of 60 Hz hum to nearby systems is thus substantially reduced.

Before discussing other arrangements, it may be pointed out that the similarity of the common mode waveforms, albeit in antiphase, suggests the possibility of a joint common-mode filter. FIG. 8 shows how a quadrifilar common mode choke can provide the filtering inductance for both microinverters.

Joint common-mode choke (200) now has a quadrifilar winding. The four wires carry the DC+ and DC− from both arrays (100-A and 100-B) to their respective microinverters. The insulation between wires of the quadrifilar winding must be sufficient to support the DC voltage difference between them. Because the common mode signals for the two inverters are out of phase, the inverters are connected to their respective wires at the opposite ends of the winding of choke (200). It may be shown that the common mode inductance required can be halved by this arrangement, that is the number of turns can be reduced by the factor 0.7 compared with using separate common-mode chokes for inverters 101-A and 101-B. Since large toroidal cores are one of the larger, heavier and more expensive components, all metrics are improved by the use of a joint common-mode choke.

In FIG. 8, the 0.01 uF common mode filter capacitors are returned to neutral while the 47 ohm damping resistors are returned to terminals (1) of the microinverters, mainly to show this variation rather than for any confirmed advantage. There is a reason behind returning the filter capacitors to neutral rather than ground, however, and that is to close the filtering current loop within the inverter so that high frequency ripple currents are not flowing through ground all the way to the service entrance (which is the only place neutral may be connected to ground) and then back on neutral. Thus it is avoided to export common-mode ripple on the power and neutral lines; this is valuable in reducing common-mode noise, with regard to non-interference with the power-line communications scheme for Smart Appliances disclosed in U.S. Pat. No. 9,614,588 by current inventor, and U.S. Pat. No. 9,785,213, also to current inventor, both of which are hereby incorporated by reference herein in their entirety.

One remaining issue with FIG. 8 is that, because the ripple on inverter pins 1 is transferred in phase to all common mode signals, common mode choke 200 as connected in FIG. 8 does not provide any filtering of this ripple, leading to the consideration of yet another arrangement.

FIG. 9 shows yet another arrangement for connecting two microinverters in series to a 240-volt split-phase grid. In FIG. 9, output terminals 1 and 2 of both inverters have been interchanged compared to FIG. 4. The result of switching terminals 1 and 2 is that the common mode signals have become of the form of those for inverter 101-A of FIG. 3, namely a 60 Hz sine wave subtracted from a 60 Hz square wave. Thus all common mode signals now exhibit a reduction of their 60 Hz components by the factor 0.27. That there is still some residual 60 Hz component has the benefit that ground leaks on any DC input line may be detected by using a 2-pole AC GFI breaker on the L1,L2 outputs. The L1, L2 currents are normally equal and opposite and thus do not trip the GFI breaker. If any DC line has a leak to ground however, the specific current phase that it has will be in phase with one of L1 and L2, thus adding to that current, and out of phase with the other of L1 and L2, thus subtracting from that current. The resulting imbalance current is the 60 Hz component of the ground leak, and an imbalance current of only 6 mA is normally sufficient to trip a GFI breaker. Since the 2 pole GFI breaker will open both hot legs, all connections to ground, neutral and grid hotlegs are removed and the whole solar system is then floating, cutting any possible return path for ground leak current and reducing it to zero ground leak current to zero. The utility of a common mode signal in detecting ground leaks was already disclosed in the above-incorporated '822 patent. To preserve the ability to employ this ground leak trip feature, no permanent electrical connection to ground, neutral or live should be made by any component in the inverter system, hence the component labeled "output relay" in FIG. 6. Arrangements should be made to open this relay upon detecting a ground fault, such as by using a signal from the above mentioned GFI breaker, which could for example be used to trip off the inverter, thus opening the output relay(s).

It was pointed out above that the output filter denoted by L1,C1 in FIG. 1 may not succeed to eliminate all high frequency switching components from the AC output of an inverter. This is especially true when the switching frequency is not very much higher than the low-pass cut off frequency of filter L1,C1. When both microinverters of FIG. 8 or FIG. 9 have residual ripple, it is desirable that the dominant spectral components of the ripple should be in-phase on terminals 1 of the FIG. 8 case or terminals 2 of the FIG. 9 case, such that there is no ripple difference voltage between corresponding pins of the two inverters; thus when those pins are joined, no ripple current flows and thus no ripple current flows to the L1 and L2 utility grid connections. Thus we desire the dominant components of ripple to be in-phase even though the inverters are generating out-of-phase 60 Hz voltages. This may be approximately achieved by coordinating the timing of the switching within each inverter through use of a common switching controller. Use of a common switching controller also reduces cost compared to uncoordinated microinverters.

FIG. 10 shows the series connection of four microinverters to a 240 v split-phase grid. Each inverter produces 60 volts RMS AC, for which the associated DC supply voltages from Sub-Arrays A, B, C and D must be at least 85 volts The two outer inverters labeled H-bridge A and H-bridge D are connected as in FIG. 9, namely with the output of the slowest switching pair of transistors connected to L1 or L2. The common mode waveforms on sub-arrays A and D are thus 85 volt peak to peak square waves with a 120 volt RMS sine wave subtracted therefrom. These waveforms are shown in FIG. 11, from which it may be seen that the common mode waveforms on sub-arrays A and D are merely antiphase versions of the same waveforms. A joint common-mode choke CML1 may thus be used for sub-arrays A and D to connect to their respective H-bridges. Due to the waveforms being in antiphase, sub-array A connects to two wires at the opposite end of the winding of CML1 compared to sub-array D. FIG. 10 omits details of the connections of common-mode filter capacitors and damping components for clarity, as its purpose is only to show the use of joint common-mode chokes CML1 and CML2.

The inner two inverters comprising H-bridges B and C powered respectively by DC from sub-arrays B and C are substantially identical to FIG. 8 except for operating with half the DC voltage input and half the AC voltage output. The common mode waveforms are thus 85 volt peak-to-peak square waves as at nodes 111 and 112 of FIG. 8, scaled down by a factor of 2:1. Inverters B and C may thus also use a joint common mode choke CML2.

The circuit of FIG. 10 may also be re-arranged so that the inner two inverters are as per FIG. 9 instead of as per FIG. 8, thus producing the common mode waveforms of FIG. 9. If the output pins of all four inverters are swapped, the circuit of FIG. 12 is produced. Since the inner two inverters H-bridges B and C are now connected as in FIG. 9, the common mode waveforms on their respective sub-arrays B and C are as per FIG. 9, namely an 85 volt peak to peak square wave from which is subtracted an 85-volt peak sine wave.

The common mode waveforms for the outer inverters A and D are the result of adding an 85 volt peak sine wave to an 85 volt peak to peak square wave, resulting in the waveforms 112 and 113 of FIG. 5, but of half the amplitude. Due to the reduced amplitude, the concern for power dissipation in the damping resistors is eliminated.

Inverters A and D of FIG. 12 may also use a joint common mode choke CML1 to connect to their respective sub-arrays A and D. FIG. 12 shows the filter capacitors of the common mode filter (the 0.01 uF capacitors of FIG. 6) being returned to utility grid neutral, as this is expected to be the cleanest available line. The damping resistors may be returned to different points however, to reduce dissipation. For example, the damping resistors for inverters B and C can be returned to the 0-volt mean point, while the damping resistors for inverter A may be returned to the junction of C1 and C2, while the damping resistor for inverter D is returned to the junction of C3 and C4. Since the common mode waveforms in the case of 4 microinverters are of reduced amplitude, and thus the concern for damping resistor dissipation is reduced, the damping resistors may be returned to a consistent place for all four microinverters, namely to the junction of C1 and C2 for inverters A and B and to the junction of C3 and C4 for inverters C and D. This allows the construction of identical modules for all four microinverters.

As mentioned previously, when two microinverters such as A and B are joined at the junction of C1 and C2, the residual unfiltered ripple that passes through their respective filters L2,C2 and L2,C2 should ideally be in phase at least for its dominant spectral component. Thus no ripple current at that frequency is created. When now the two inverter pairs, each with their dominant ripple component canceled, are joined at the junction of L2 and L3, the second most dominant ripple component from each inverter pair should be in-phase at that point before they are joined, thus avoiding creating ripple current also at the second most dominant ripple spectral component. This can be approximately arranged by using a common switching controller to coordinate the switching of all H-bridges to minimize total ripple currents or voltages exported to the grid that are not at the desired line frequency. In fact, using N inverters in series (or parallel) theoretically allows N−1 unwanted ripple components to be canceled.

Ripple cancellation of parallel- or series-connected microinverters may be achieved by the following consideration: When the clock frequency phase of a switching inverter is shifted by Phi, Fourier components at N times the clock frequency are shifted by N.Phi. Thus a number M of inverters connected in series or parallel and having their clock phase relatively shifted by 0, Phi, 2Phi, 3Phi . . . (M−1)Phi will have ripple frequency components at N times the clock frequency shifted by 0, NPhi, 2NPhi, 3NPhi - - - (M−1)NPhi. If Phi is chosen to be 2π/M, the sum of such ripple components is substantially canceled for N=1, 2 . . . (M−1), thus canceling the first M−1 harmonics of the switching frequency.

Microinverters may also be combined in parallel, as has been pioneered by Enphase Inc. However, according to the current invention, physically combining microinverters in groups of two, four or more can produce not only cost reductions due to sharing components such as common mode chokes, switching controllers and mechanical housings, but also produce technical benefits such as ripple reduction through using the common controller to coordinate switching to that end.

In the case of paralleling microinverters, output currents and ripple currents add; therefore it is desired that the dominant components of the ripple currents cancel as far as possible even though the 60 Hz current components shall add in phase. This is again facilitated by coordinating the switching by means of a common controller.

FIG. 13 shows four microinverters (200-A,200-B,200-C, 200-D) broadly conforming to the basic scheme of FIG. 1, connected in parallel to feed power to a 240 volt split-phase grid connection though 2-pole GFI breaker (500). Each microinverter now has to produce the full 240 volts RMS, which requires a DC input from their respective photovoltaic sub-arrays (300-A,300-B,300-C,300-D) of at least 340 volts. By co-housing the microinverters, they can share common components and in particular the octofilar common mode choke (400).

All of the microinverters of FIG. 13 operate in phase at 60 Hz, and so create identical common-mode waveforms. As there is no connection to ground or anything else (apart from capacitance of the solar arrays to ground), Kirchoff's law requires that the sum of the currents in the L1,N and L2 paths through 2-pole GFI breaker (500) is zero; this is exactly the condition for not tripping the breaker. On the other hand, if an accidental path from any array terminal to ground were created, the current imbalance in GFO breaker (500) would cause it to trip, interrupting the ground fault leakage current. Moreover, disconnection of a grid-tie inverter from the grid will cause it to stop inverting, thus open the above mentioned output relays and eliminating any AC or DC voltages on the array relative top ground.

Any or all of microinverters 200-A to 200-D of FIG. 13 may be any of the inverters 3, 4, 8, 9 10 or 12. For example, if inverters 200A-200D each comprise a pair of series connected inverters as in FIG. 4, the eight inverters may jointly use a 16-filar common-mode choke. Moreover, using a common switching controller for all eight inverters allows seven ripple components to be canceled by coordinating their switching.

In the prior art, microinverters were integrated with respective solar panels, thereby achieving the benefit of eliminating DC wiring, but hindering the use of common components and thus increasing cost. The inventive microinverter arrangements described above may achieve minimum system cost when all coupled microinverters are co-housed to allow use of common components. DC wiring is nevertheless still substantially eliminated if the co-housed microinverters are located sufficiently close to the array such that no DC wiring is more than 10 feet away from the array. The 10 foot distance is defined in the National Electrical Code as the distance, beyond which the above mentioned new, unusual and onerous safety requirements for DC wiring apply, and which it is desired to avoid. A person skilled in the art may devise many configurations of coupled microinverters using the teachings disclosed herein, all of which are considered to fall within the scope and spirit of the invention as described by the attached claims.

I claim:

1. A DC to AC inverter arrangement for converting Direct Current (DC) power from photovoltaic sub-arrays to Alternating Current (AC) power of a desired AC output voltage or current at output terminals and having a sinusoidal waveform of a desired frequency comprising:

a number of substantially identical microinverters combined in the same mechanical housing, each microinverter being configured to be powered from a respective photovoltaic sub-array via a positive and a negative DC input terminal, and configured so that the positive and negative input terminals from each sub-array get connected through a common mode filter comprising a common-mode choke to the positive and negative terminals of an associated smoothing capacitor, the positive and negative terminals of the smoothing capacitor also being connected to the positive and negative inputs of an associated H-bridge configuration of switching transistors, at least one output of each H-bridge being connected through a low pass filter to attenuate switching frequency components and to obtain a corresponding filtered H-bridge output across the microinverter output terminals, wherein one output terminal of at least a first microinverter is connected to a first output terminal of the inverter and one output terminal of at least a second microinverter is connected to a second output terminal of the inverter, and wherein the other output terminals of the microinverters are connected in parallel, series, or series parallel configuration;

a common switching controller configured to control the switching of each H-bridge in each of said microinverters to connect a first output terminal of each H-bridge via an appropriate switching transistor of the H-bridge alternately at said desired AC output frequency to the positive and the negative H-bridge inputs from the respective terminals of said associated smoothing capacitor while controlling a second output of each H-bridge to connect via another appropriate switching transistor of the H-bridge alternately to the same or opposite polarity H-bridge input at a high switching frequency with a duty factor chosen so as to provide an effective mean value equal to a point on said sinusoidal waveform;

wherein the outputs of said microinverters are combined at the inverter outputs to provide said desired voltage or current having said sinusoidal waveform; and wherein said common mode choke is a multifilar common mode choke having 2M mutually insulated parallel windings, each pair of windings being used to connect the positive and negative terminals of a sub-array to the associated microinverter's smoothing capacitor and H-bridge, thereby sharing the same common mode choke among a number M of microinverters.

2. The arrangement of claim 1 whereby said common switching controller controls said high frequency switching of each of said microinverter's H-bridge's second output terminals to the same or opposite polarity H-bridge input using a switching clock phase that is staggered across all microinverters so as to achieve reduction of as many dominant ripple components as possible at said combined output.

3. The arrangement of claim 1 in which said microinverter outputs are combined in series at said combined output.

4. The arrangement of claim 1 in which said microinverter outputs are combined in parallel at said combined output.

5. The arrangement of claim 1 in which said microinverter outputs are combined in a series parallel combination.

6. The arrangement of claim 1 in which a first of said microinverters generates a first approximately sinusoidal waveform at a first output voltage at its second output terminal relative to its first output terminal and a second of said microinverters generates a second approximately sinusoidal waveform at a second output voltage at its second output terminal relative to its first output terminal, the second approximately sinusoidal waveform being in antiphase with the first approximately sinusoidal waveform, and the outputs of said first and second microinverters are constructively combined in series by connecting the first output terminals of both microinverters together to obtain a combined approximately sinusoidal waveform of voltage equal to the sum of said first output voltage and said second output voltage between the second output terminals of said first and second microinverters.

7. The arrangement of claim 1 in which a first of said microinverters generates a first approximately sinusoidal waveform at a first output voltage at its second output terminal relative to its first output terminal and a second of said microinverters generates a second approximately sinusoidal waveform at a second output voltage at its second output terminal relative to its first output terminal, the second approximately sinusoidal waveform being in antiphase with the first approximately sinusoidal waveform, and the outputs of said first and second microinverters are constructively combined in series by connecting the second output terminals of both microinverters together to obtain a combined approximately sinusoidal waveform of voltage equal to the sum of said first output voltage and said second output voltage between the first output terminals of said first and second microinverters.

8. The arrangement of claim 1 in which said combined output at said output terminals is connected to an electricity grid and said microcontroller controls said voltage and current to cause a desired power flow from said DC to AC inverter arrangement into said electricity grid.

9. The arrangement of claim 1 in which said output terminals are connected to the L1 and antiphase L2 of a 120/240 v 60 Hz split phase utility grid and each microinverter's positive and negative input terminals for DC from its respective sub-array are decoupled to grid neutral with a capacitor, the connection to neutral being interruptible by means of a output relay.

10. The arrangement of claim 1, further comprising:
the number of substantially identical microinverters comprise at least one pair of associated microinverters, wherein a first microinverter of each pair is powered by DC from a respective first sub-array of photovoltaic cells and the second microinverter of each pair is powered by a respective second photovoltaic sub-array of photovoltaic cells, and the first and second sub-arrays of cells are interleaved in a pattern such that groups of cells associated with a first microinverter of each pair of microinverters are physically located between groups of cells associated with second microinverters of each pair of microinverters;
the common switching controller controls said first and second microinverters so that said first microinverters generate a sinusoidal voltage or current output of a first phase and said second microinverters generate a sinusoidal voltage or current output in antiphase to said first phase; and
wherein the outputs of said first and second microinverters are constructively combined in parallel by reversing the output terminals of the antiphase second inverters relative to the output terminals of the first inverters in order to obtain said AC power output of desired voltage or current and frequency, or alternatively the outputs are constructively combined in series by connecting a terminal of an antiphase second converter to a corresponding terminal of a first inverter.

11. The arrangement of claim 1 wherein said switching controller is configured to control the H-bridges of a first subset of said microinverters to produce a common mode signal on their respective positive and negative input terminals of frequency equal to said desired AC output frequency and of a first phase and to control the H-bridges of a second subset of said microinverters to produce a common mode signal on their respective positive and negative input terminals of frequency equal to said desired AC output frequency and of a second phase in antiphase to said first phase.

12. The arrangement of claim 1 wherein said switching controller is configured to control the H-bridges of a first subset of said microinverters to produce a common mode signal on their respective positive and negative input terminals of frequency equal to said desired AC output frequency and of a first phase and to control the H-bridges of a second subset of said microinverters to produce a common mode signal on their respective positive and negative input terminals of frequency equal to said desired AC output frequency and of a second phase in antiphase to said first phase, and said common mode choke is a multifilar common mode choke having pairs of parallel windings equal in number to the number of microinverters, and said positive and negative input terminals of said first subset of microinverters connect to a first end of their assigned windings of said multifilar common mode choke while said positive and negative input terminals of said second subset of microinverters connect to an end of their assigned windings opposite to said first end.

13. A method of DC to AC conversion for converting Direct Current power from a photovoltaic array to Alternating Current power of a desired AC output voltage or current at output terminals and having a sinusoidal waveform of a desired frequency comprising:
    configuring a number of substantially identical DC to AC converting microinverters each to receive a portion of said Direct Current power from a separate, electrically isolated, sub-array section of said photovoltaic array and each generating a portion of said desired output voltage or current at an associated pair of output terminals;
    controlling said microinverters with a common controller such that the portion of said desired AC output voltage or current produced by a first subset of said microinverters is in antiphase at corresponding pairs of output terminals with the portion of the desired AC voltage or current produced by a second subset of said microinverters; and
    combining the outputs of said microinverters in series or parallel or series-parallel such that either their corresponding portions of the said desired AC output voltage add constructively or their corresponding portions of said desired AC output current add constructively or both their voltage and current portions add constructively.

14. The method of claim 13 wherein said number of microinverters is equal to M, the Direct Current voltage from each of said sub-array sections of said photovoltaic array is approximately 1/Mth of the square root of 2 times said desired AC output voltage, and said output terminal pairs of said M microinverters are connected in series in such a way that their contributions to said desired AC output voltage add constructively.

15. The method of claim 13 in which controlling said microinverters with a common controller comprises:
    controlling the switching of an H-bridge of switching transistors of each of said first subset of microinverters, the H-bridge being connected to the DC input from the corresponding sub-array section, such that the DC positive and negative inputs are alternately connected to a first of said output terminal pairs of said first of microinverters at said desired output frequency while the second of said output terminal pairs is connected alternately to said positive or negative DC input at a high switching frequency and with a duty factor that gives a mean value equal to a point on said desired sinusoidal waveform; and
    controlling the switching of an H-bridge of switching transistors of each of said second subset of microinverters, the H-bridge being connected to the DC input from the corresponding sub-array section, such that the respective DC positive inputs of each of said second subset of microinverters is connected to a first of said output terminal pairs of said second subset of microinverters when the respective DC negative inputs of said first subset of microinverters are connected to the first of their respective output terminal pairs, and such that the respective DC negative inputs of each of said second subset of microinverters is connected to the first of said output terminal pairs of said second subset of microinverters when the respective DC positive inputs of said first subset of microinverters are connected to the first of their respective output terminal pairs.

16. The method of claim 13 in which controlling said microinverters with a common controller comprises:
    controlling the switching of an H-bridge of switching transistors of each of said microinverters, the H-bridge being connected to the DC input from the corresponding sub-array section, such that the DC positive and negative inputs are alternately connected to a first of said output terminal pairs of said microinverters at said desired output frequency while the second of said output terminal pairs is connected alternately to said positive or negative DC input at a high switching clock frequency and with a duty factor that gives a mean value equal to a point on said desired sinusoidal waveform; and
    staggering the timing of said high frequency switching clock between different microinverters such that, when their outputs are combined, the greatest number of switching frequency related spectral components are substantially canceled.

17. The method of claim 13 wherein the step of configuring a number of substantially identical DC to AC converting microinverters each to receive a portion of said Direct Current power from a separate, electrically isolated, sub-array section of said photovoltaic array comprises coupling the negative and positive polarity connections from each sub-array DC input through an assigned pair of mutually insulated windings of a common, multifilar, common-mode choke to the associated microinverter, wherein the sub-array inputs of said first subset of microinverters connect to a first end of their assigned pairs of said multifilar windings and the sub-array inputs of said second subset of microinverters connect to a second end opposite to said first end of the multifilar winding pairs assigned to the second subset of microinverters.

18. The method of claim 13 in which controlling said microinverters with said common controller results in a common mode signal appearing on each associated sub-array section of said photovoltaic array when operating, the common mode signal being equal in frequency to said desired AC output frequency.

19. The method of claim 13 in which controlling said microinverters with said common controller results in a common mode signal appearing on the associated sub-array section of said photovoltaic array when operating, the common mode signal being a square wave combined with a sinewave equal in frequency to said desired AC output frequency.

20. A DC to AC inverter arrangement for converting Direct Current (DC) power from photovoltaic sub-arrays to Alternating Current (AC) power of a desired AC output voltage or current at output terminals and having a sinusoidal waveform of a desired frequency comprising:
a number of substantially identical microinverters combined in the same mechanical housing, each microinverter being configured to be powered from a respective photovoltaic sub-array via a positive and a negative DC input terminal, and configured so that the positive and negative input terminals from each sub-array get connected through a common mode filter comprising a common-mode choke to the positive and negative terminals of an associated smoothing capacitor, the positive and negative terminals of the smoothing capacitor also being connected to the positive and negative inputs of an associated H-bridge configuration of switching transistors, at least one output of each H-bridge being connected through a low pass filter to attenuate switching frequency components and to obtain a corresponding filtered H-bridge output across the microinverter output terminals, wherein one output terminal of at least a first microinverter is connected to a first output terminal of the inverter and one output terminal of at least a second microinverter is connected to a second output terminal of the inverter, and wherein the other output terminals of the microinverters are connected in parallel, series, or series parallel configuration;
a common switching controller configured to control the switching of each H-bridge in each of said microinverters to connect a first output terminal of each H-bridge via an appropriate switching transistor of the H-bridge alternately at said desired AC output frequency to the positive and the negative H-bridge inputs from the respective terminals of said associated smoothing capacitor while controlling a second output of each H-bridge to connect via another appropriate switching transistor of the H-bridge alternately to the same or opposite polarity H-bridge input at a high switching frequency with a duty factor chosen so as to provide an effective mean value equal to a point on said sinusoidal waveform;
wherein the outputs of said microinverters are combined at the inverter outputs to provide said desired voltage or current having said sinusoidal waveform; and
wherein said common switching controller controls said high frequency switching of each of said microinverter's H-bridge's second output terminals to the same or opposite polarity H-bridge input using a switching clock phase that is staggered across all microinverters so as to achieve reduction of as many dominant ripple components as possible at said combined output.

21. The arrangement of claim 20 in which said common mode choke is a multifilar common mode choke having 2M mutually insulated parallel windings, each pair of windings being used to connect the positive and negative terminals of a sub-array to the associated microinverter's smoothing capacitor and H-bridge, thereby sharing the same common mode choke among a number M of Microinverters.

22. The arrangement of claim 20 in which said microinverter outputs are combined in series at said combined output.

23. The arrangement of claim 20 in which said microinverter outputs are combined in parallel at said combined output.

24. The arrangement of claim 20 in which said microinverter outputs are combined in a series parallel combination.

25. The arrangement of claim 20 in which a first of said microinverters generates a first approximately sinusoidal waveform at a first output voltage at its second output terminal relative to its first output terminal and a second of said microinverters generates a second approximately sinusoidal waveform at a second output voltage at its second output terminal relative to its first output terminal, the second approximately sinusoidal waveform being in antiphase with the first approximately sinusoidal waveform, and the outputs of said first and second microinverters are constructively combined in series by connecting the first output terminals of both microinverters together to obtain a combined approximately sinusoidal waveform of voltage equal to the sum of said first output voltage and said second output voltage between the second output terminals of said first and second microinverters.

26. The arrangement of claim 20 in which a first of said microinverters generates a first approximately sinusoidal waveform at a first output voltage at its second output terminal relative to its first output terminal and a second of said microinverters generates a second approximately sinusoidal waveform at a second output voltage at its second output terminal relative to its first output terminal, the second approximately sinusoidal waveform being in antiphase with the first approximately sinusoidal waveform, and the outputs of said first and second microinverters are constructively combined in series by connecting the second output terminals of both microinverters together to obtain a combined approximately sinusoidal waveform of voltage equal to the sum of said first output voltage and said second output voltage between the first output terminals of said first and second microinverters.

27. The arrangement of claim 20 in which said combined output at said output terminals is connected to an electricity grid and said microcontroller controls said voltage and current to cause a desired power flow from said DC to AC inverter arrangement into said electricity grid.

28. The arrangement of claim 20 in which said output terminals are connected to the L1 and antiphase L2 of a 120/240 v 60 Hz split phase utility grid and each microinverter's positive and negative input terminals for DC from its respective sub-array are decoupled to grid neutral with a capacitor, the connection to neutral being interruptible by means of a output relay.

29. The arrangement of claim 20, further comprising:
the number of substantially identical microinverters comprise at least one pair of associated microinverters, wherein a first microinverter of each pair is powered by DC from a respective first sub-array of photovoltaic cells and the second microinverter of each pair is powered by a respective second photovoltaic sub-array of photovoltaic cells, and the first and second sub-arrays of cells are interleaved in a pattern such that groups of cells associated with a first microinverter of each pair of microinverters are physically located between groups of cells associated with second microinverters of each pair of microinverters;
the common switching controller controls said first and second microinverters so that said first microinverters generate a sinusoidal voltage or current output of a first phase and said second microinverters generate a sinusoidal voltage or current output in antiphase to said first phase; and wherein the outputs of said first and second microinverters are constructively combined in parallel by reversing the output terminals of the antiphase second inverters relative to the output terminals of the first inverters in order to obtain said AC power output of desired voltage or current and frequency, or alternatively the outputs are constructively combined in series by connecting a terminal of an antiphase second converter to a corresponding terminal of a first inverter.

* * * * *